US005745060A

United States Patent [19]
McCartney et al.

[11] Patent Number: 5,745,060
[45] Date of Patent: Apr. 28, 1998

[54] GAIN CALIBRATION CIRCUITRY FOR AN ANALOG TO DIGITAL CONVERTER

[75] Inventors: Damien McCartney; John O'Dowd, both of Limerick, Ireland

[73] Assignee: Analog Devices, Inc., Norwood, Mass.

[21] Appl. No.: 600,313

[22] Filed: Feb. 12, 1996

[51] Int. Cl.[6] .................................................. H03M 1/10
[52] U.S. Cl. ........................... 341/120; 341/143; 341/172
[58] Field of Search .............................. 341/120, 142, 341/172

[56] References Cited

U.S. PATENT DOCUMENTS

| | | | |
|---|---|---|---|
| 4,399,426 | 8/1983 | Tan | 341/120 |
| 4,943,807 | 7/1990 | Early et al. | 341/120 |
| 5,134,401 | 7/1992 | McCartney et al. | 341/143 |
| 5,159,341 | 10/1992 | McCartney et al. | 341/143 |
| 5,363,102 | 11/1994 | Ferguson, Jr. | 341/172 |
| 5,510,789 | 4/1996 | Lee | 341/120 |

OTHER PUBLICATIONS

Analog Devices, 3V/5, CMOS, 500 µA, Signal Conditioning ADC, AD7714, Oct. 1994.
Analog Devices, Lc²MOS, Signal Conditioning ADC, AD7710, Jul. 1995.

Primary Examiner—Marc S. Hoff
Attorney, Agent, or Firm—Fish & Richardson P.C.

[57] ABSTRACT

A method, and apparatus, for calibrating a delta sigma modulator. The delta sigma modulator includes an integrating amplifier circuit with an integrating capacitor for producing an output indicative of an amount of charge held on the integration capacitor. During the calibration mode, a feedback signal sampling section samples a feedback signal and transfers packets of charge corresponding to such sampled feedback signal to the integrating capacitor in each modulator cycle and an input signal section samples a calibration signal and transfers packets of charge corresponding to a portion of the calibration signal to the integrating capacitor in each modulator cycle. With such an arrangement, some charge is transferred to the integration capacitor in each modulator cycle thus reducing idle-tones.

13 Claims, 9 Drawing Sheets

FIG.2A RF 
FIG.2B AN 
FIG.2C I1R 
FIG.2D I2R 
FIG.3A RF 
FIG.3B AN 
FIG.3C I1R 
FIG.3D I2R 
FIG.4A RF 
FIG.4B AN 
FIG.4C I1R 
FIG.4D I2R 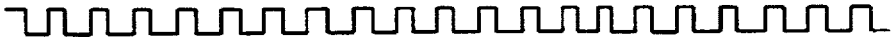
FIG.5A RF 
FIG.5B AN 
FIG.5C I1R 
FIG.5D I2R 

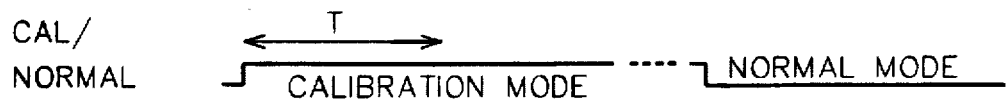

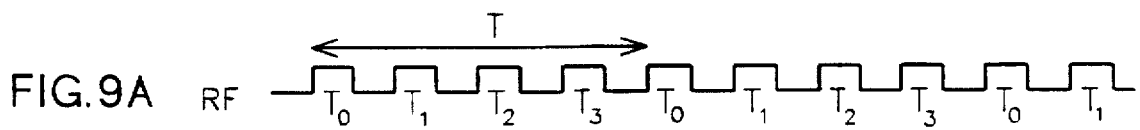
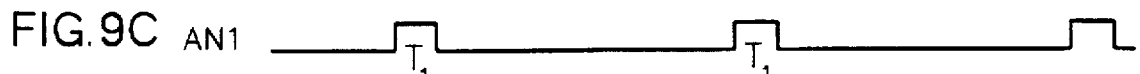
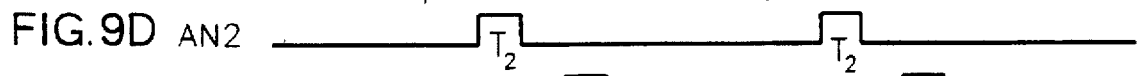
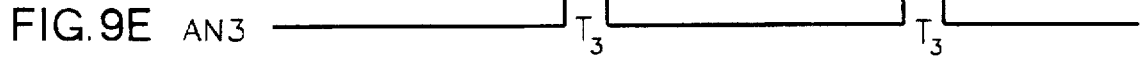

FIG.13A RF 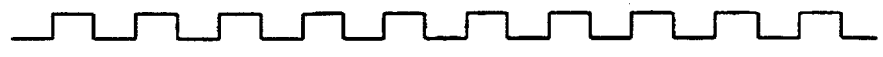
FIG.13B AN0 
FIG.13C AN1 
FIG.13D AN2 
FIG.13E AN3 
FIG.13F I1R 
FIG.13G I2R 
FIG.14A RF 
FIG.14B AN0 
FIG.14C AN1 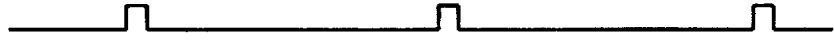
FIG.14D AN2 
FIG.14E AN3 
FIG.14F I1R 
FIG.14G I2R 

GAIN CALIBRATION CIRCUITRY FOR AN ANALOG TO DIGITAL CONVERTER

BACKGROUND OF THE INVENTION

This invention relates generally to analog to digital converters and more particularly to calibration circuits and methods adapted for use in over-sampled analog to digital converters.

As is known in the art, analog to digital converters (ADCs) are widely used in converting an analog signal into a corresponding digital signal. During the analog to digital conversion process, however, different types of errors may arise in the ADC. One such error is commonly referred to as the ADC gain error. More particularly, an ADC converts an analog input signal into a series of an N bit binary coded digital words. A reference voltage, $V_{REF}$, is fed to the ADC. The value of the reference voltage, $V_{REF}$, establishes the range of input voltage, $V_{IN}$ (i.e., the analog signal being converted). In an ideal (i.e., error free) N-bit ADC, an incremental change, $\Delta=[V_{REF}/2^N]$ in the input voltage, $V_{IN}$, will result in the least significant bit (LSB) of the digital word changing by 1 for a unipolar input voltage range. With a bipolar input voltage range, an incremental change $\Delta'=[V_{REF}/2^{N-1}]$ in the input voltage, $V_{IN}$, will result in the least significant bit (LSB) of the digital word changing by 1.

However, in real ADCs, active device mismatch and other manufacturing imperfections give rise to gain and offset errors. An offset error is evident if, for a zero input voltage, the ADC produces a non-zero digital word for a unipolar range and a code different from $2^{N-1}$ for a bipolar range (assuming offset binary coding). Generally, a full-scale error is evident if, with an input voltage equal to $V_{REF}$, the ADC does not produce a digital word $2^N$ (for both unipolar and bipolar ranges). Thus, the full-scale error is made up of the offset error and a gain, or span, error. Therefore, the gain error is the full-scale error less the offset error and is sometimes expressed as a percentage of the full-scale range of the ADC. Because of such errors, the input voltage that produces an output code of $2^N$ may be greater, or less, than the expected full scale voltage, $V_{FS}$, by an amount related to the error.

As is also known in the art, various techniques have been developed to calibrate out (i.e., correct for) these offset and gain errors. One technique is with analog circuitry, such as variable resistors in an operational amplifier network. The ADC input is offset and scaled by the network in order that the input signal is pre-conditioned with voltages to result in the ADC producing a zero digital word with a zero input voltage and a digital word $2^N$ with an input voltage equal to $V_{FS}$.

Another technique is through digital calibration. Here, the calibration sequence involves first applying a zero input to the ADC. Any resulting non-zero digital word is stored as an offset error in an offset register. Next, a calibration voltage $V_{CAL}$, here $V_{FS}$, is applied and the digital word produced is stored. The stored digital word is then offset corrected by subtracting from it the contents of the offset register. Now the resulting digital word corresponds to either $2^N$ or $2^{N-1}$ output codes depending on whether it is a unipolar or bipolar range. A gain factor may be calculated as the number that when used to multiply the offset corrected conversion result will result in the desired output code. The gain factor is stored in a gain register so that, during normal operation, the results are first offset corrected by subtraction of the offset register and then gain corrected by multiplication by the gain register to produce an error free output code.

As is also known in the art, one type of ADC is an over-sampling ADC where multiple input samples are used to form a single digital word sample of the input signal. One such over-sampling ADC is a delta sigma ADC. One such delta sigma ADC is described in U.S. Pat. No. 5,134,401 issued Jul. 28, 1992 entitled "Delta Sigma Modulator Having Programmable Gain/Attenuation", inventors Damien McCartney and David R. Welland, assigned to the same assignee as the present invention, the contents thereof being incorporated herein by reference. Such modulator is included as modulator 9 in the ADC 10 shown in FIG. 1.

Thus, referring to FIG. 1, modulator 9 includes an input 11 fed by an analog input signal and an input 13 fed by a reference voltage, $V_{REF}$, as shown. The modulator 9 includes an input signal sampling circuit 12, a feedback signal sampling circuit 14, an integrating amplifier 16 having an integration capacitor $C_{INTGR}$, a filter 18, a comparator 20, a buffer 22 and a programmable control unit 24 all arranged as shown and described in the above reference U.S. Pat. No. 5,134,401. Thus, the input signal sampling circuit 12 includes four switches $S_1$, $S_2$, $S_3$, $S_4$, and an input capacitor, $C_{IN}$, arranged as shown, and controlled by binary signals on lines AN, $\overline{AN}$, I1R and I2R, respectively as shown. (It is noted that the signal on line AN is the complement of the signal on line $\overline{AN}$). Likewise the feedback sampling circuit 14 includes four switches $S_5$, $S_6$, $S_7$, $S_8$, and a reference capacitor, $C_{RF}$, as shown controlled by binary signals on lines RF, $\overline{RF}$, R1R, R2R, respectively, as shown. (It is noted that the signal on line RF is the complement of the signal on line $\overline{RF}$). The control signals on lines AN, $\overline{AN}$, I1R, I2R, RF, $\overline{RF}$, R1R, and R2R are produced by the programmable control unit 24 as described in the above reference U.S. Pat. No. 5,134,401 and such signals are shown for lines RF, AN, I1R, and I2R, in FIGS. 2A, 2B, 2C and 2D, respectively.

In normal operation, the signal on line RF is the basic clock signal for modulator 9 clock, as shown in FIG. 2A. The input voltage of the analog signal $A_{IN}$ is sampled and a charge corresponding to the voltage of the sampled signal is stored on capacitor $C_{IN}$ when switches $S_1$ and $S_3$ are closed (in response to a pulse, logic 1, on lines AN and I1R) and switches $S_2$ and $S_4$ are open (in response to a logic 0 on complementary signal line $\overline{AN}$ and line I2R). The stored charge is then transferred to input summing node 19 of the integrator 16 when switches $S_2$ and $S_4$ are closed (in response to a pulse, logic 1, on line AN and line I2R) and switches $S_1$ and $S_3$ are open (in response to a logic 0 on lines AN and I1R). The rate at which the samples taken by the input sampler are transferred to the summing node 19 (i.e., the rate that pulses are produced on line I2R) is the rate at which pulses are produced on line AN (and hence on complementary signal line $\overline{AN}$). The feedback sampler 14 may add either positive charge or negative charge at input summing node 19 as described in the above referenced U.S. Patent in order to produce a net zero charge at the summing node 19.

The gain of the modulator 9 may be selected in accordance with the ratio of the rate charge stored on capacitor $C_{IN}$ is transferred to the summing node 19 (i.e., the rate of the pulses on line I2R) to the rate charge stored on the capacitor $C_{RF}$ is transferred to the summing node 19, (i.e., the modulator clock rate, that is, the rate of the pulses on line RF). Thus, in FIGS. 2A through 2D the pulses trains on lines RF, AN, I1R and I2R, are shown, respectively, for normal operation of modulator 10 (FIG. 1) with a gain of K, here one. (In FIGS. 4A through 4D, the pulses trains on lines RF, AN, I1R and I2R, are shown, respectively, for normal operation of modulator 10 (FIG. 1) with a gain of 2K, here two). It should also be noted that the falling edges of the signals on lines I1R and I2R occur before the corresponding falling edges of the signals on lines RF and AN, as described in the above referenced U.S. Patent, for making the charge-injection associated with switch opening signal independent. In a given phase of the signal on line RF, the modulator 9 output determines whether the signal on line R1R is active or whether the signal on line R2R is active. This is how a feedback corresponding to $V_{REF}$ or to $-V_{REF}$ is achieved, where $V_{REF}$ is the magnitude of the feedback signal produced by modulator 9. The signals on lines R1R and R2R are omitted in the interest of clarity.

Typically, such over-sampling ADCs do not use the full range of the modulator 9. By appropriately scaling the input capacitor, $C_{IN}$, and the reference capacitor, $C_{REF}$, the density of ones at the output of the modulator can be limited to 10% to 90%, for example, for the full range of analog input voltage. This avoids excess noise that arises if there is an output sequence having either a large number of ones or a large number of zeros.

A voltage $V_{CAL}$ is available for calibration; i.e., typically, but not always, the available reference voltage, $V_{REF}$. The gain calibration is performed by connecting the calibration voltage $V_{CAL}$ to the ADC input 11 (FIG. 1). In some cases the full scale range, may be very much less than the calibration voltage, $V_{CAL}$, for example if the ADC is incorporating amplification. In such case, the value of the input capacitor, $C_{IN}$, would be considerably greater than the value of $C_{REF}$. As discussed above and in the above referenced U.S. Pat. No. 5,134,401, the sampling rate at which the capacitor $C_{IN}$ stores charge may be greater (by a factor R) than the rate at which the reference capacitor, $C_{REF}$ stores charge. That is, in some applications, the full scale range may be $V_{CAL}/G$, where G is the factor by which the full scale input is less than the calibration voltage $V_{CAL}$. One technique suggested to generate a suitable voltage is to attenuate $V_{CAL}$ by a factor of G; however, because any practical attenuator will itself introduce gain error the use of most resistor or switched-capacitor attenuators are not adequate.

Another technique suggested to obtain an attenuation, G, of the calibration voltage, $V_{CAL}$, is to sub-sample such calibration voltage. That is, the calibration voltage $V_{CAL}$ is applied to the analog input and sampled with the input capacitor $C_{IN}$ once every G samples; the other G-1 samples being zero samples. However, with such technique, if G is greater than R, the sampling rate by $C_{IN}$ of $V_{CAL}$ will be less than that by $C_{REF}$ of $V_{REF}$. This may mean that the input signal is only sampled every 2 or more modulation cycles with zero samples in the intervening cycles. While such technique is adequate in many applications, in some applications driving the delta sigma ADC with such a periodic signal may give rise to excess noise that will often appear at low frequencies and which are sometimes called "idle tones". This results in noisy or unrepeatable gain calibration which may not be satisfactory.

More particularly, if a gain calibration were to be performed with an attenuation factor of four (i.e., G=4), first $A_{IN}$ is set equal to $V_{CAL}$. Attenuation of the input $A_{IN}$ is achieved by removing three pulses on line AN, for every four pulses on line RF, as shown in FIGS. 3A through 3D, where the pulses on line RF are shown in FIG. 3A and the pulses on line AN are shown in FIG. 3B. Thus, instead of transferring a charge of $V_{CAL}C_{IN}$ during each of the pulses on line RF, or here a total charge, $Q_T=4V_{CAL}C_{IN}$, for each four RF pulses, a calibration charge, $Q_{CAL}=Q_T/4=V_{CAL}C_{IN}$ is transferred once for each set of four RF pulses. To put it still another way, to obtain an attenuation factor G, during each period, T, a calibration charge $QV_{CAL}=V_{CAL}C_{IN}$ is transferred once every (G) RF pulses. It should be noted that the signals on lines I1R and I2R (FIGS. 3C and 3D, respectively) are unaltered from those shown in FIGS. 2C and 2D in order to maintain the same level of charge injection as in the normal operation, thereby having the same offset.

For a calibration mode where a sampling ratio R=2 and an attenuation factor, G=8, are provided, reference is made to FIGS. 5A through 5D, where FIGS. 5A through 5D show the signals on lines RF, AN, I1R and I2R, respectively. Here, while three pulses on line AN are removed for every four pulses on line RF, the rate of pulses on line I2R is twice that of the pulses on line RF. Therefore, in the general case, for a gain R (where R is the ratio of the pulse rate on line I2R to the pulse rate on line RF), to obtain an attenuation factor G, during each period, T, a calibration charge $Q_{CAL}=V_{CAL}C_{IN}$ is transferred once every (G/R) RF pulses.

In should be noted from FIGS. 3A–3D and FIGS. 5A–5D, that output charge is sampled only during the modulator cycles in which line AN is pulsed (i.e., "active") with the consequential idle-tone problems discussed above.

SUMMARY OF THE INVENTION

In accordance with the present invention a method for calibrating a delta sigma modulator is provided. The delta sigma modulator includes an integrating amplifier circuit with an integrating capacitor for producing an output indicative of an amount of charge held on the integration capacitor. During the calibration mode, a feedback signal sampling section samples a feedback signal and transfers packets of charge corresponding to such sampled feedback signal to the integrating capacitor, and an input signal section samples a calibration signal and transfers packets of charge corresponding to a portion of the calibration signal to the integrating capacitor.

In accordance with one feature of the invention, a delta sigma modulator includes an integrating amplifier circuit with an integrating capacitor for producing an output indicative of an amount of charge held on the integration capacitor. A feedback signal sampling section samples a feedback signal and transfers packets of charge corresponding to such sampled feedback signal to the integrating capacitor. An input signal sampling section is adapted for coupling to an input signal during a normal operating mode and transferring packets of charge $A_{IN}C_{IN}$ to the integrating capacitor, where CIN is the capacitance between an input of the sampling section and the integrating capacitor. During a calibration mode, the input signal sampling section is adapted for coupling a calibration voltage, $V_{CAL}$. In the calibration mode, the capacitance between the input and the integrating capacitance is reduced by a factor, G, and portions of the charge $V_{CAL}C_{IN}$ are transferred to the integrating capacitor.

With such an arrangement, some charge is transferred to the integration capacitor during the calibration more often thereby reducing idle-tones.

BRIEF DESCRIPTION OF THE DRAWING

Other features of the invention, as well as the invention itself will be more readily understood with reference to the following detailed description taken together with the accompanying drawings, in which:

FIGS. 2A–2D are timing diagrams of control signals used by the ADC of FIG. 1 during normal operation to provide such ADC with a sampling ratio R=1;

FIGS. 3A–3D are timing diagrams of control signals used by the ADC of FIG. 1 during a calibration mode to attenuate a calibration signal fed thereto by a factor, G, of four and to provide such ADC with a sampling ratio R=1;

FIGS. 4A–4D are timing diagrams of control signals used by the ADC of FIG. 1 during normal operation to provide such ADC with a sampling ratio R=2;

FIGS. 5A–5D are timing diagrams of control signals used by the ADC of FIG. 1 during a calibration mode to attenuate a calibration signal fed thereto by a factor, G, of eight and to provide such ADC with a sampling ratio R=2;

FIGS. 7A–7D are timing diagrams of control signals used by the ADC of FIG. 6 during a calibration mode and a normal operating mode;

FIGS. 9A–9G are timing diagrams of control signals used by the ADC of FIG. 8 during a calibration mode to attenuate a calibration signal fed thereto by a factor, G, of four and to provide such ADC with a sampling ratio R=1;

FIGS. 10A–10G are timing diagrams of control signals used by the ADC of FIG. 8 during normal operation to provide such ADC with a sampling ratio R=1;

FIGS. 11A–11G are timing diagrams of control signals used by the ADC of FIG. 8 during a calibration mode and a subsequent normal operation mode to attenuate a calibration signal fed thereto by a factor, G, of four and to provide such ADC with a sampling ratio R=1;

FIGS. 12A–12G are timing diagrams of control signals used by the ADC of FIG. 8 during a calibration mode to attenuate a calibration signal fed thereto by a factor, G, of eight and to provide such ADC with a sampling ratio R=1;

FIGS. 13A–13G are timing diagrams used by the ADC of FIG. 8 during normal operation to provide such ADC with a sampling ratio R=2;

FIGS. 14A–14G are timing diagrams of control signals used by the ADC of FIG. 8 during a calibration mode to attenuate a calibration signal fed thereto by a factor, G, of eight and to provide such ADC with a sampling ratio R=2; and, FIG. 15 is an input sampling circuit adapted for use in a delta sigma ADC according to an alternative embodiment of the invention.

DESCRIPTION OF THE PREFERRED EMBODIMENTS

Figure 6:
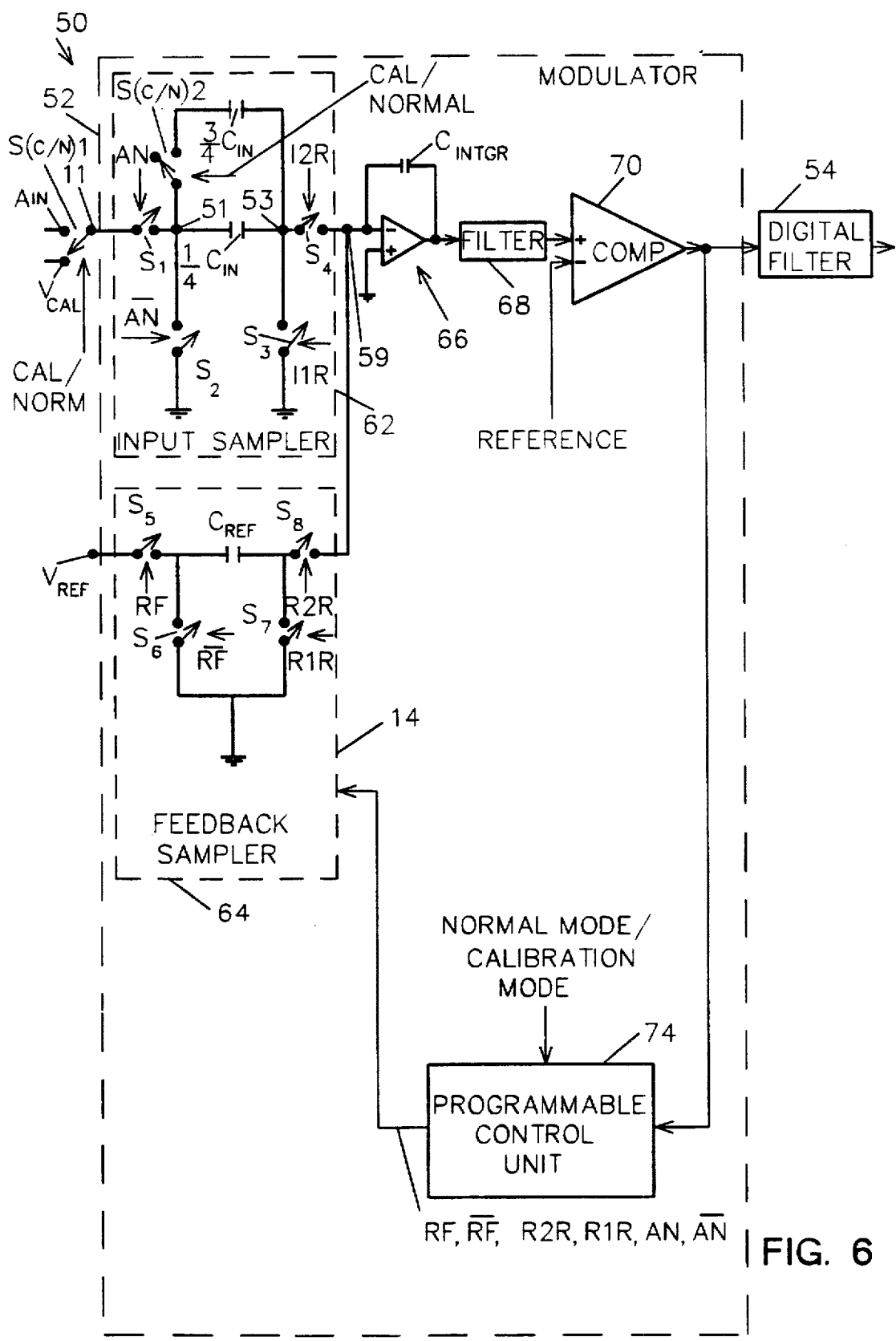
FIG. 6 is a delta sigma ADC according to the invention.

Referring now to FIG. 6, a delta sigma ADC 50 is shown to include a modulator 52 and a digital filter 54. The digital filter 54 is of any conventional type used to process the binary stream of data produced by the modulator 52 and converting them into a sequence of multi-bit digital words. The modulator 52 includes an input signal sampler 62, a feedback signal sampler 64, an integrating amplifier 66 having an integration capacitor $C_{INTGR}$, a filter 68, for example, a second integrator in the case of a second order modulator, a comparator 70, and a programmable control unit 74 all arranged as shown. The feedback signal sampling circuit 64, like the feedback signal sampler 14 in FIG. 1, includes four switches $S_5$, $S_6$, $S_7$, $S_8$, and a reference capacitor, $C_{RF}$, as shown controlled by binary signals on lines RF, $\overline{RF}$, R1R, R2R, respectively, as shown. (As noted above in connection with FIG. 1, the signal on line RF is the complement of the signal on line $\overline{RF}$). The control signals on lines RF, $\overline{RF}$, R1R, and R2R are produced by the programmable control unit 74 as described in the above reference U.S. Patent 5,134,401 and such signal are shown for line RF in FIG. 7A.

The input signal sampling circuit 62 includes a plurality of, here two, capacitors $C_{IN}/4$ and $3C_{IN}/4$ and four switches $S_1$, $S_2$, $S_3$, and $S_4$, arranged as shown. The capacitance of capacitor $C_{IN}/4$ is $C_{IN}/4$; the capacitance of capacitor $3C_{IN}/4$ is $3C_{IN}/4$. The switches $S_1$ and $S_2$ are controlled by binary signals on lines AN and $\overline{AN}$, respectively, as shown. (It is noted that the signal on line AN is the complement of the signal on line $\overline{AN}$).

In normal operation, the pulses on line RF provides the basic modulator 52 clock, as shown in FIG. 7A. The pulses on lines AN, I1R and I2R are shown in FIGS. 7B through 7D, respectively. It is first noted that the rate of pulses on line RF is equal to the rate of pulses on line I1R, therefore the modulator 52 has a sampling ratio, R, of one.

The input voltage of the analog signal $A_{IN}$ is fed to terminal 11 through switch $S_{(C/N)1}$. Also, capacitors $C_{IN}/4$ and $3C_{IN}/4$ are connected in parallel by switch $S_{(C/N)2}$ to, during the normal operating mode, provide a total capacitance, $C_T=C_{IN}$, between nodes 51, 53, as shown. Thus, the total charge stored by the two capacitors, $C_{IN}/4$ and $3C_{IN}/4$ is the same as that stored in input signal switching section 12 (FIG. 1) in response to the pulses described above in connection with FIGS. 2A–2D. Thus, the modulator 52 operates as input signal switching section 12 (FIGS. 1, 2A–2D) and without any attenuation of the input signal $A_{IN}$.

Charge corresponding to AIN is stored on the two capacitors $C_{IN}/4$, $3C_{IN}/4$ when switches $S_1$ and $S_3$ are closed and switches $S_2$ and $S_4$ are open. The stored charge is transferred to input summing node 59 of the integrator 66 when switches $S_1$ and $S_3$ are open and switches $S_2$ and $S_4$ are closed. The feedback sampler 64 may add either positive charge or negative charge at input summing node 119 as described in the above referenced U.S. Patent in order to produce a net zero charge at the summing node 59.

Figure 1:
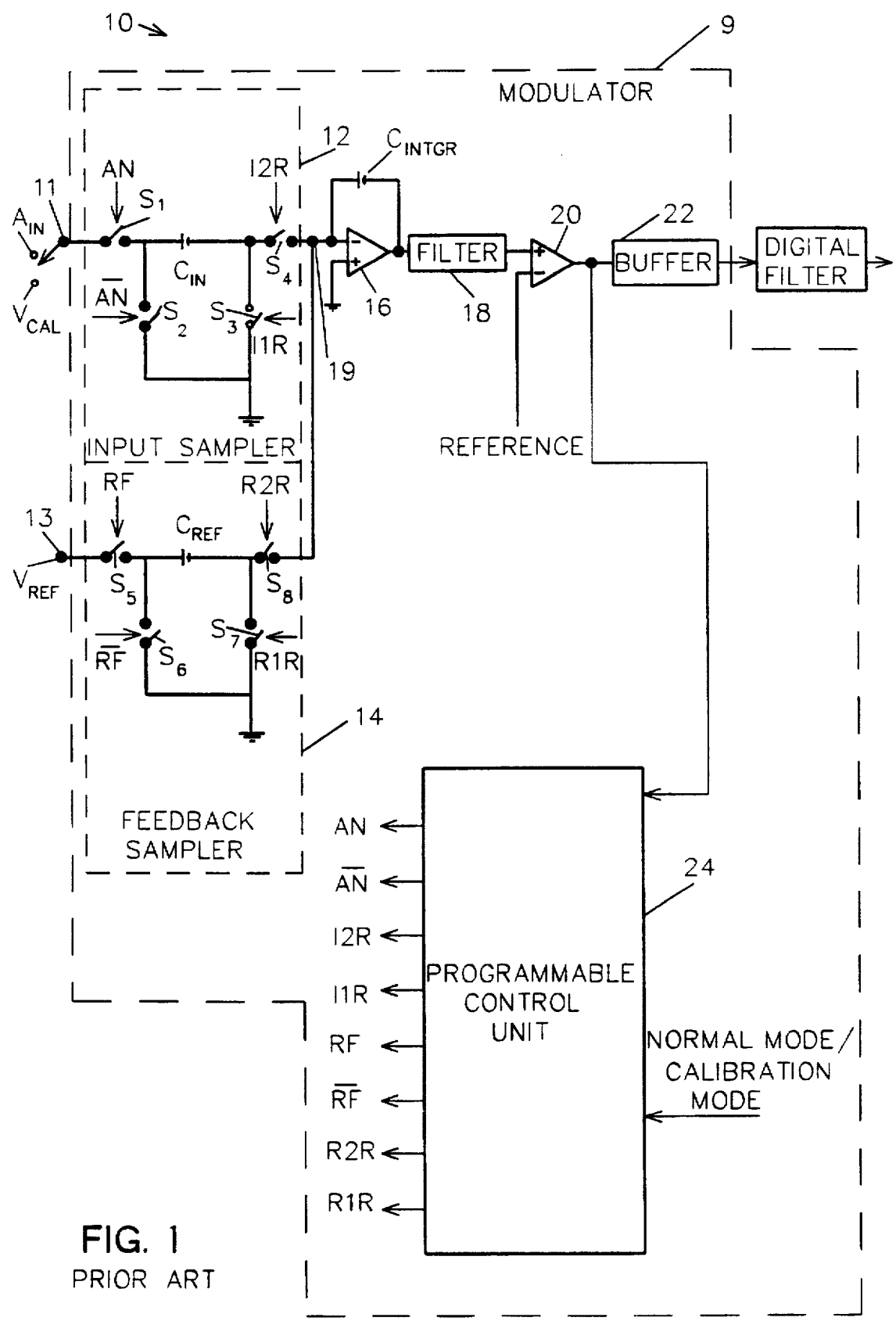
FIG. 1 is a schematic block diagram of a delta sigma ADC according to the prior art.

During the calibration mode, a calibration signal, a voltage $V_{CAL}$, here $V_{REF}$, is fed to terminal 11 through switch $S_{(C/N)1}$ and capacitor $3C_{IN}/4$ is decoupled from node 51 by switch $S_{(C/N)2}$. Thus, a capacitor $C_{IN}/4$ having one-fourth the capacitance of $C_{IN}$ is coupled across nodes 51 and 53. It follow then that for each four RF pulses, (such four pulses being produced in a time duration, T) instead of transferring one calibration charge $Q_{CAL}=V_{CAL}C_{IN}=4V_{FS}C_{IN}$, a charge $V_{CAL}C_{IN}/4=Q_{CAL}/4=V_{FS}C_{IN}$ will be transferred for each four RF pulses. More particularly, and referring back to FIGS. 3A–3D, an attenuation factor G of 4 is achieved with modulator 9 (FIG. 1) by transferring charge, $Q_{CAL}$ to the summing node 59 during the period, T; here, however, with modulator 52 (FIG. 6), charge $Q_{CAL}/4$ is transferred to the summing node 59 at the same rate as the pulses on line RF (i.e., the modulator clock rate). It is noted, however, that after each series of four successive modulator clock pulses on line RF, the same amount of charge, i.e. $Q_{CAL}$, is transferred to summing node 59 (FIG. 6) as was transferred to summing node 19 (FIG. 1). Here, however, because some charge, $Q_{CAL}/4$ is transferred to the summing node 59 at the modulator clock rate, idle-tones have been reduced.

To put it another way, during the calibration mode, the feedback signal sampling section 54 samples a feedback signal, $V_{REF}$ and transfers packets of charge corresponding to such sampled feedback signal to the integrating capacitor $C_{INTGR}$ in each modulator cycle corresponding to the rate pulses are produced on line RF and an input signal sampling section 52 samples a calibration signal, $V_{CAL}$, here $V_{REF}$, and transfers packets of charge corresponding to a portion, here one fourth, of the calibration signal to the integrating capacitor $C_{INTGR}$ in each modulator cycle. With such an arrangement, some charge is transferred to the integration capacitor in each modulator cycle thereby reducing idle-tones.

In the more general case, an input signal sampling section 62 is adapted for coupling to an input signal, $A_{IN}$, during a normal operating mode and transferring packets of charge $A_{IN}C_{IN}$, to the integrating capacitor, where $C_{IN}$ is the capacitance between an input of the sampling section and the integrating capacitor, $C_{INTGR}$. During a calibration mode, the input signal sampling section 11 is adapted for coupling a calibration voltage, $V_{CAL}$, here $V_{REF}$. In the calibration mode, the capacitance between the input and the integrating capacitance, $C_{INTGR}$, is reduced by a factor, G, and portions of a charge $V_{CAL}C_{IN}$ are transferred to the integrating capacitor.

Figure 8:
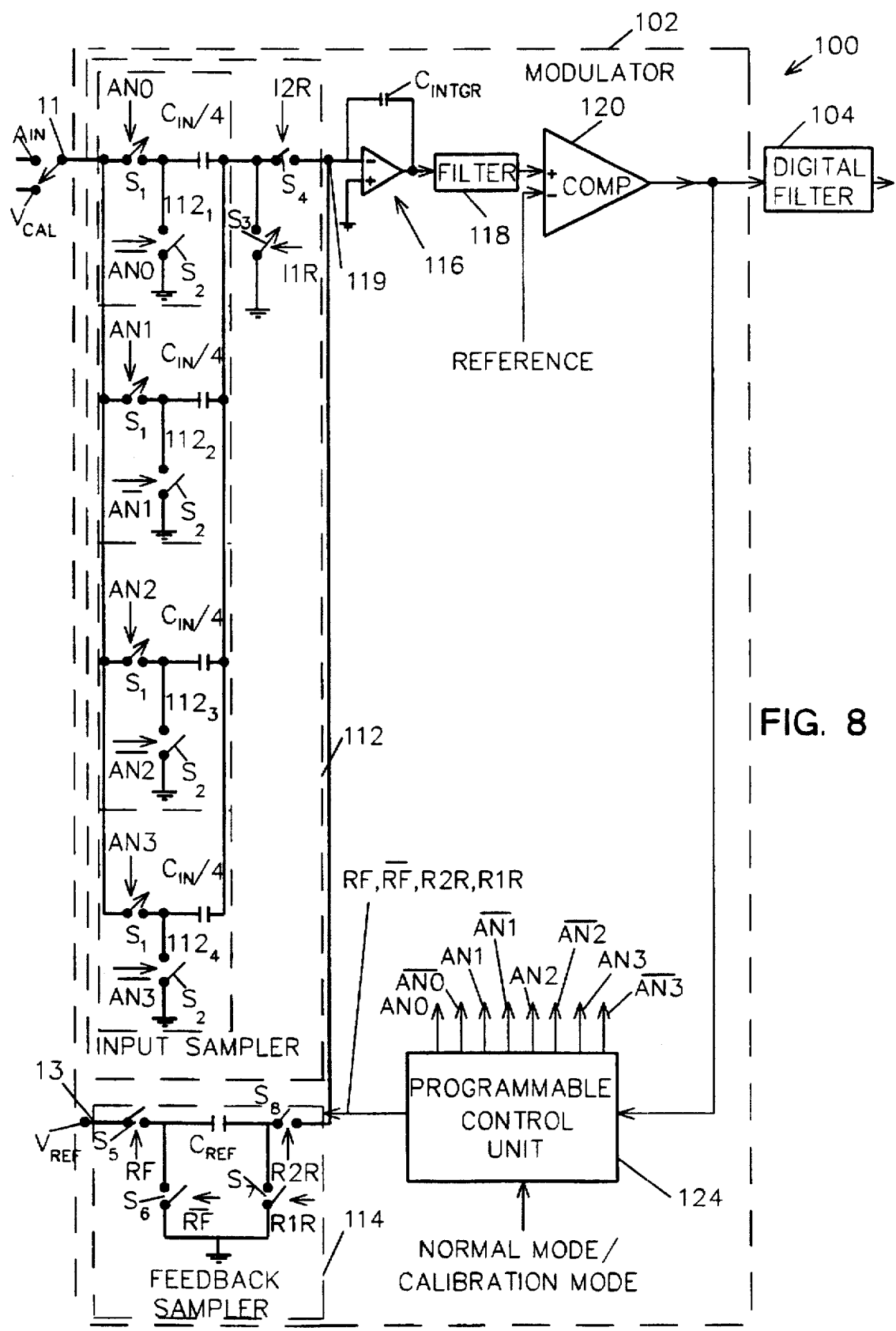
FIG. 8 is a delta sigma ADC according to an alternative embodiment of the invention.

Referring now to FIG. 8, a delta sigma ADC 100 is shown to include a modulator 102 and a digital filter 104. The digital filter 104 is of any conventional type used to process the binary stream of data produced by the modulator 102 and converting them into a sequence of multi-bit digital words. The modulator 102 includes an input signal sampler 112, a feedback signal sampler 114, an integrating amplifier 116 having an integration capacitor $C_{INTGR}$, a filter 118, for example, a second integrator in the case of a second order modulator, a comparator 120, and a programmable control unit 124 all arranged as shown. The feedback signal sampling circuit 114, like the feedback signal sampler 14 in FIG. 1, includes four switches $S_5$, $S_6$, $S_7$, $S_8$, and a reference capacitor, $C_{RF}$, as shown controlled by binary signals on lines RF, $\overline{RF}$, R1R, R2R, respectively, as shown. (As noted above in connection with FIG. 1, the signal on line RF is the complement of the signal on line $\overline{RF}$). The control signals on lines RF, $\overline{RF}$, R1R, and R2R are produced by the programmable control unit 124 as described in the above reference U.S. Pat. No. 5,134,401 and the signal for line RF is shown in FIG. 9A.

The input signal sampling circuit 112 includes a plurality of, here four, input signal sub-sampling circuits $112_1$, $112_2$, $112_3$ and $112_4$, as shown. Each one of the sub-sampling circuits $112_1$, $112_2$, $112_3$ and $112_4$ is identical in construction and includes two switches $S_1$ and $S_2$, and an input capacitor, $C_{IN}/4$, arranged as shown. The binary control signals for switches $S_1$, and $S_2$ of sub-sampling circuit $112_1$ are controlled by binary signals on lines AN0 and $\overline{AN0}$, respectively. (It is noted that the signal on line AN0 is the complement of the signal on line $\overline{AN0}$). The binary control signals for switches $S_1$ and $S_2$ of sub-sampling circuit $112_2$ are controlled by binary signals on lines AN1 and $\overline{AN1}$, respectively, as shown. (It is noted that the signal on line AN1 is the complement of the signal on line $\overline{AN1}$). The binary control signals for switches $S_1$ and $S_2$ of sub-sampling circuit $112_3$ are controlled by binary signals on lines AN2 and $\overline{AN2}$, respectively as shown. (It is noted that the signal on line AN2 is the complement of the signal on line $\overline{AN2}$). The binary control signals for switches $S_1$ and $S_2$ of sub-sampling circuit $112_4$ are controlled by binary signals on lines AN3 and $\overline{AN3}$, respectively, as shown. (It is noted that the signal on line AN3 is the complement of the signal on line $\overline{AN3}$).

In normal operation, the pulses on line RF provides the basic modulator 102 clock, as shown in FIG. 10A. The input voltage of the analog signal AIN is fed to terminal 11 of input signal sampling circuit 112 and sampled by each one of the switches $S_1$ in sub-sampling circuits $112_1$–$112_4$, in response to pulses on lines AN0–AN3, shown in FIGS. 10B through 10E, respectively. It is noted that each one of the capacitors $C_{IN}/4$ has a capacitance one fourth the capacitance of capacitor $C_{IN}$ in FIG. 1. Thus, because all of the switches $S_1$–$S_4$ are closed at the same time, the total capacitance between the input 11 and the integrating capacitor $C_{INTGR}$ is $C_{IN}$ and the charge stored by the four capacitors in the input signal switching circuit 112 is the same as that stored in input signal switching section 12 (FIG. 1) in response to the pulses described above in connection with FIGS. 2A–2D. That is, because the binary signals on lines AN0–AN3 are in phase with each other during the normal operating mode, and as shown in FIGS. 10A–10G and in phase with the binary signal on line I1R (the signal on line I2R being delayed by one half modulator period), the modulator 102 operates as input signal switching section 12 (FIGS. 1, 2A–2D) and without any attenuation of the input signal $A_{IN}$.

Charge corresponding to the sampled voltage is stored on all four capacitors $C_{IN}/4$ and is transferred to input summing node 119 of the integrator 116 when switches $S_1$ and $S_3$ are open and switches $S_2$ and $S_4$ are closed. The rate at which the samples taken by the input sampler are transferred to the summing node 119 (i.e., the rate that pulses are produced on line I2R) is the rate at which pulses are produced on lines AN0–AN3. The feedback sampler 114 may add either positive charge or negative charge at input summing node 119 as described in the above referenced U.S. Patent in order to produce a net zero charge at the summing node 119.

During the calibration mode, a calibration signal, here a voltage $V_{CAL}$, here $V_{REF}$, is fed to terminal 11. Further, the pulses on lines AN0–AN3 produced by programmable control 124 are shown in FIGS. 9B–9E. (It is noted that the pulses on lines RF, I1R and I2R do not change between the normal mode and the calibration mode when the same gain, here unity gain, is used). More particularly, and referring back to FIGS. 3A–3D, an attenuation factor G of 4 is achieved with modulator 9 (FIG. 1) by transferring charge, $Q_{CAL}=V_{CAL}C_{IN}$ to the summing node 19 once every four pulses on line RF; i.e. during the period of time, T. Here, with modulator 102 (FIG. 8), charge $Q_{CAL}/4$ is transferred to the summing node 119 at the same rate as the pulses on line RF (i.e., the modulator clock rate). The amount of charge transferred during each modulator 102 clock pulse on line RF is one-fourth, (i.e., $Q_{CAL}/4$) the amount of charge transferred during each one of the set of four RF pulses used in the modulator 9 (FIG. 1). It is noted, however, that after each series of four successive modulator clock pulses on line RF, the same amount of charge, i.e. $Q_{CAL}$, is transferred to summing node 119 (FIG. 7) as was transferred to summing node 19 (FIG. 1). Here, however, because some charge is transferred to the summing node 119 at the modulator clock rate, idle-tones have been reduced.

To put it another way, during the calibration mode, the feedback signal sampling section 114 samples a feedback signal, $V_{REF}$ and transfers packets of charge corresponding to such sampled feedback signal to the integrating capacitor $C_{INTGR}$ in each modulator cycle corresponding to the rate pulses are produced on line RF and an input signal sampling section 112 samples a calibration signal, $V_{CAL}$, here $V_{REF}$, and transfers packets of charge corresponding to a portion, here one fourth, of the calibration signal to the integrating capacitor CINTGR in each modulator cycle. With such an arrangement, some charge is transferred to the integration capacitor in each modulator cycle thereby reducing idle-tones.

Referring now to FIGS. 11A–11G, timing diagrams of timing signal on lines RF, AN0, AN1, AN2 AN3, I1R and I2R, respectively, are shown during both an initial calibration mode and a subsequent normal operating mode for the modulator 102 in FIG. 8. It is first noted that here during the calibration mode switches $S_1$ of sub-sampling sections $112_2$, $112_3$, $112_4$ remain open while switch $S_1$ of sub-sampling section $112_1$ operates at the same rate pulses are produced on line RF. Thus, during the calibration mode, modulator 102 operates with such switching operation as the modulator 52, FIG. 6. During the normal operating mode, switches $S_1$ of all the sub-sampling sections $112_1$, $112_2$, $112_3$, $112_4$ operate together thereby increasing the capacitance between input 11 and summing node 119 from $C_{IN}/4$ to $C_{IN}$.

Referring now to FIGS. 12A–12G, timing diagrams of control signals on lines RF, AN0, AN1, AN2 AN3, I1R and I2R, respectively, are shown during a calibration mode to attenuate a calibration signal fed thereto by a factor, G, of eight and to provide ADC 100 with a sampling ratio R=1. It is noted that in this arrangement, while calibration charge is not produced at the same rate as the rate pulses are produced on line RF, there will still be some reduction in "idle tones". In any event, the input signal sampling section 112 is adapted for coupling to an input signal during a normal operating mode and transferring packets of charge $A_{IN}C_{IN}$, to the integrating capacitor, where $C_{IN}$ is the capacitance between an input of the sampling section the integrating capacitor. During a calibration mode, the input signal sampling section 112 is adapted for coupling a calibration voltage, $V_{CAL}$, here $V_{REF}$. In the calibration mode, the capacitance between the input and the integrating capacitance is reduced by a factor, G/2, and portions of the charge $V_{CAL}C_{IN}$ are transferred to the integrating capacitor.

FIGS. 13A–13G are timing diagrams of control signals on lines RF, AN0, AN1, AN2 AN3, I1R and I2R, respectively, and used by the ADC 100 during normal operation to provide such ADC with a sampling ratio R=2. FIGS. 14A–14G are timing diagrams of control signals on lines RF, AN0, AN1, AN2, AN3, I1R and I2R, respectively, and used by the ADC 100 during a calibration mode to attenuate a calibration signal fed thereto by a factor, G, of eight and to provide such ADC 100 with a sampling ratio R=2.

Figure 15A:
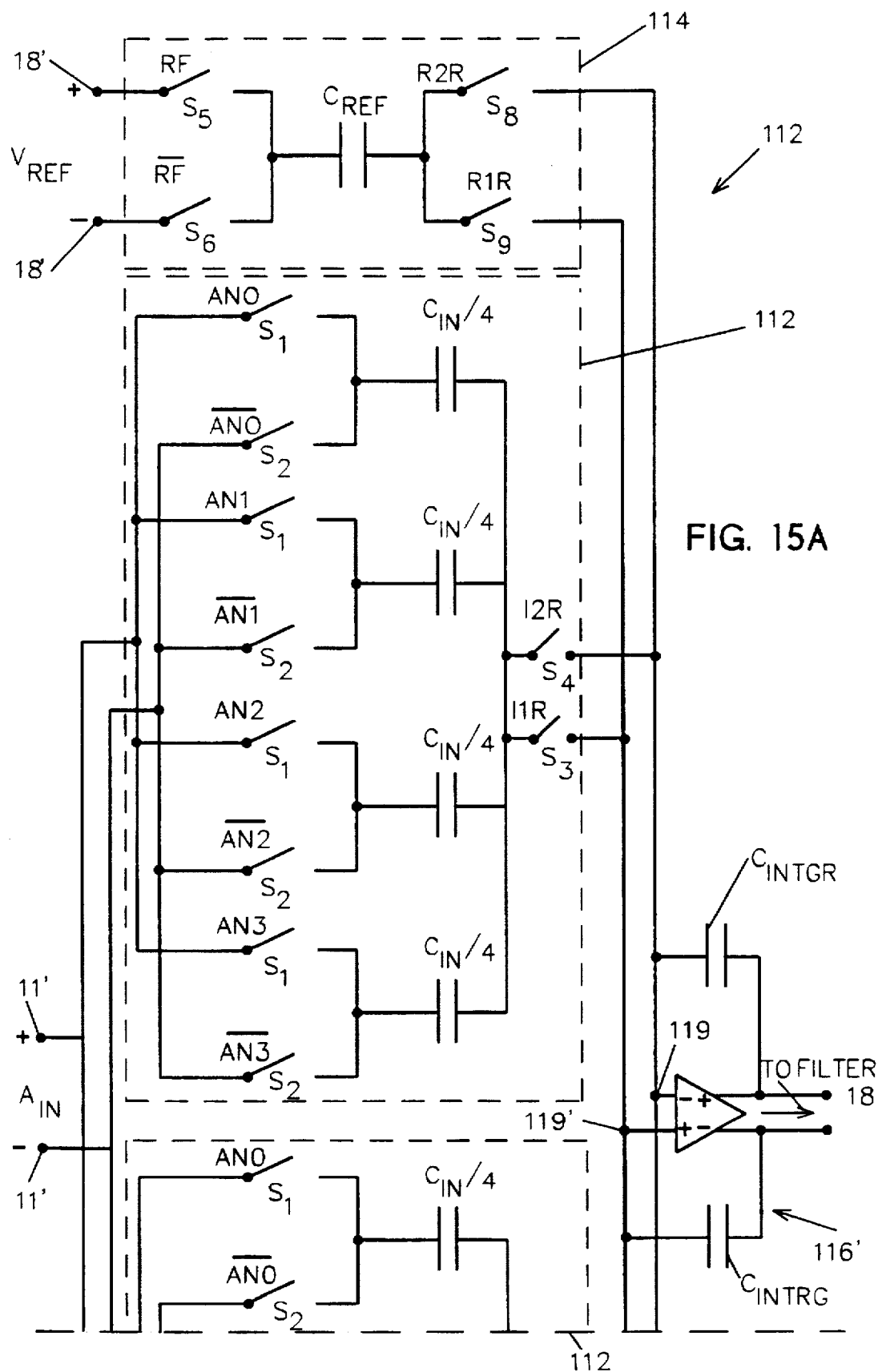
Figure 15:
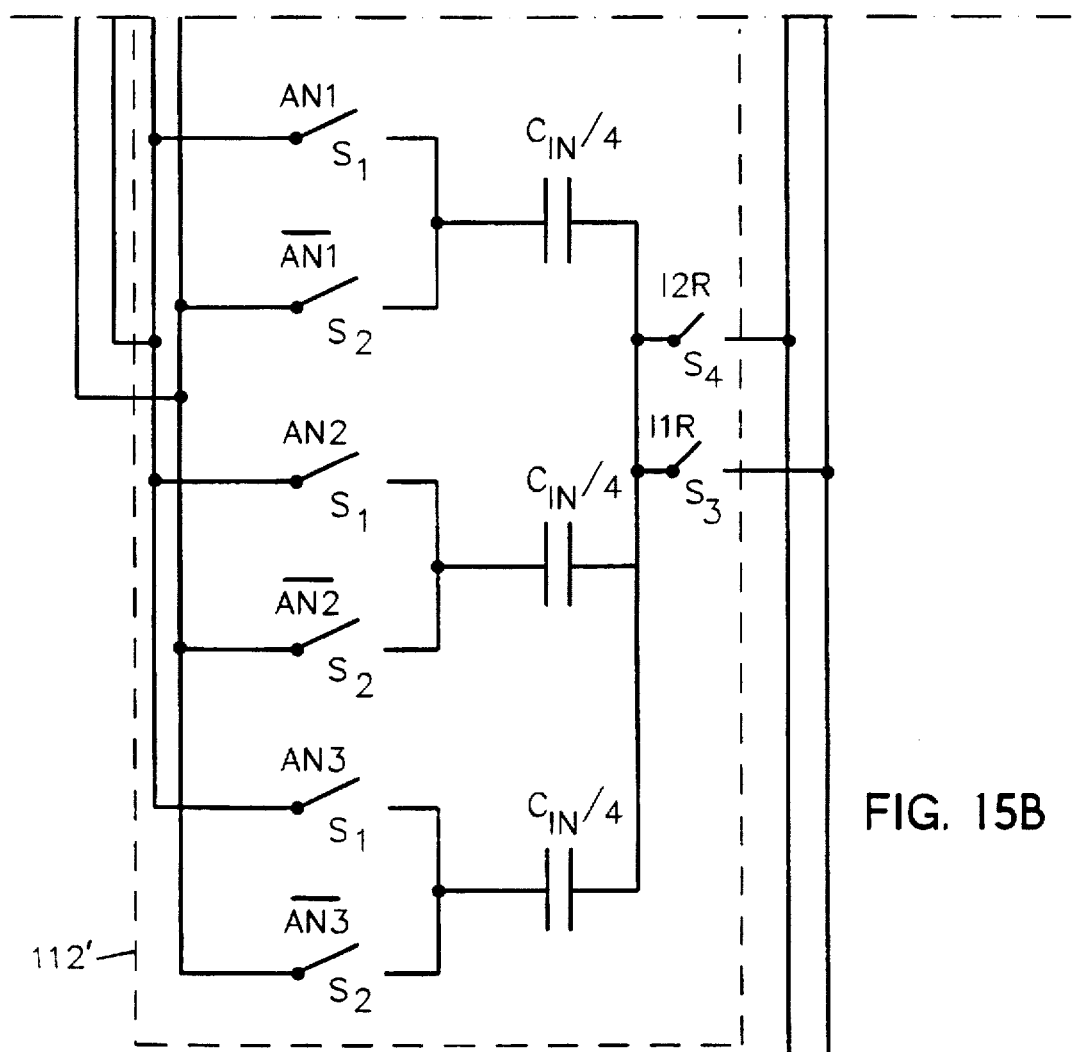
Figure 15B:
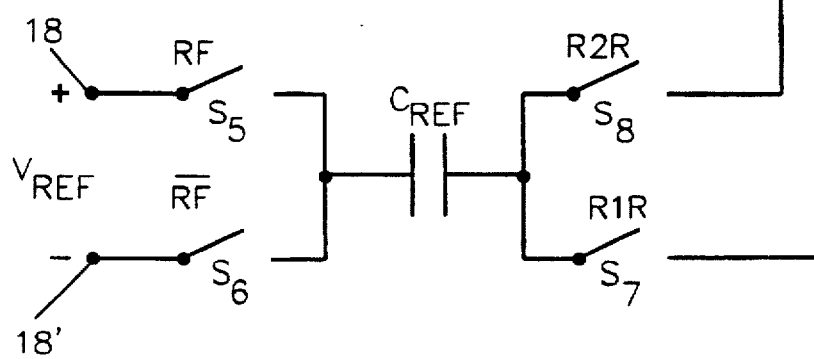

Referring now to FIG. 15, an input signal section adapted for use with a bipolar input signal $A_{IN}$ is shown. Equivalent elements as those shown in FIG. 8 are designated by the same numerical designation. It is noted that a differential calibration voltage, $V_{CAL}$, here $V_{REF}$, is connected to terminals 11, 11' during the calibration mode. It is also noted that a differential reference voltage, $V_{REF}$, is connected to terminals 18–18' during both the calibration mode and the normal operating mode. It is further noted that the outputs of switches $S_7$ and $S_8$ are connected to a summing node 119' which is fed to the non-inverting input (+) of integrating amplifier 116', as shown.

Other embodiments are within the spirit and scope of the appended claims.

What is claimed is:

1. A delta sigma modulator, comprising:

a feedback signal sampling section for sampling a feedback signal and transferring charge packets corresponding to such sampled feedback signal to a summing node;

an input signal sampling section for sampling a calibration voltage and transferring charge packets corresponding to a fractional portion of the calibration voltage to the summing node.

2. A delta sigma modulator, comprising:

an integrating amplifier circuit, having an integrating capacitor, for producing an output indicative of an amount of charge held on the integration capacitor;

a feedback sampling section for, during a calibration mode, sampling a feedback signal and for transferring charge packets corresponding to such sampled voltage to the integrating capacitor;

an input sampling section for, during the calibration mode, sampling a calibration voltage and transferring charge packets corresponding to a fractional portion of the calibration voltage to the integrating capacitor.

3. A method for calibrating a delta sigma modulator, such modulator having an integrating amplifier circuit with an integrating capacitor for producing an output indicative of an amount of charge held on the integration capacitor, such method comprising the steps of:

sampling a feedback signal and transferring packets of charge corresponding to such sampled feedback signal to the integrating capacitor; and, sampling a calibration signal and transferring packets of charge corresponding to a fractional portion of the calibration signal to the integrating capacitor.

4. A delta sigma modulator, comprising:

a feedback signal sampling section for sampling a feedback signal and transferring charge packets corresponding to such sampled feedback signal to a summing node;

an input signal sampling section for sampling a calibration voltage and transferring charge packets corresponding to a fractional portion of the calibration voltage to the summing node over periods of time, T, where the total charge transferred over each period of time, T, corresponds to the calibration voltage.

5. A delta sigma modulator, comprising:

an integrating amplifier circuit, having an integrating capacitor, for producing an output indicative of an amount of charge held on the integration capacitor;

a feedback sampling section for, during a calibration mode, sampling a feedback signal and for transferring charge corresponding to such sampled voltage to the integrating capacitor;

an input sampling section for, during the calibration mode, sampling a calibration voltage each modulator cycle and transferring charge corresponding to a fractional portion of the calibration voltage to the summing node over periods of time, T, where the total charge transferred over each period of time, T, corresponds to the calibration voltage.

6. A method for calibrating a delta sigma modulator, such modulator having an integrating amplifier circuit with an integrating capacitor for producing an output indicative of an amount of charge held on the integration capacitor, such method comprising the steps of:

sampling a feedback signal and transferring packets of charge corresponding to such sampled feedback signal to the integrating capacitor; and, sampling a calibration signal and transferring packets of charge corresponding to a fractional portion of the calibration signal to the integrating capacitor over periods of time, T, where the total charge transferred over each period of time, T, corresponds to the calibration voltage.

7. A delta sigma modulator, comprising:

a feedback signal sampling section for sampling a feedback signal and transferring charge packets corresponding to such sampled feedback signal to a summing node each modulator cycle;

an input signal sampling section having a plurality of capacitors for, during a calibration mode, sampling a calibration voltage with a fractional portion of the plurality of capacitors and transferring charge packets representative of the sampled calibration voltage to the summing node, and for sampling an input voltage, $A_{IN}$, during a normal operating mode with the plurality of capacitors and transferring change representative of the input voltage to the summing node.

8. A delta sigma modulator, comprising:

a feedback signal sampling section for sampling a feedback signal and transferring charge packets corresponding to such sampled feedback signal to a summing node each modulator cycle;

an input signal sampling section having a plurality of capacitors for, during a calibration mode, sampling a calibration voltage with a portion of the plurality of capacitors and transferring charge packets representative of the sampled calibration voltage to the summing node, and for sampling an input voltage, $A_{IN}$, during a normal operating mode with the plurality of capacitors and transferring change representative of the input voltage to the summing node; and, wherein the calibration voltage is sampled by a different one of the plurality of capacitors over a corresponding different portion of a period of time, T, the plurality of capacitors sampling the calibration voltage over the period of time T.

9. An delta sigma modulator, comprising:

a feedback signal sampling section for sampling a feedback signal and transferring charge packets corresponding to such sampled feedback signal to a summing node in each modulator cycle;

an input signal sampling section for sampling a calibration voltage and transferring charge packets corresponding to a fractional portion of the calibration voltage to the summing node in each modulator cycle.

10. A method for calibrating a delta sigma modulator, such modulator having an integrating amplifier circuit with an integrating capacitor for producing an output indicative of an amount of charge held on the integration capacitor, such method comprising the steps of:

sampling a feedback signal and transferring packets of charge corresponding to such sampled feedback signal to the integrating capacitor in each modulator cycle; and, sampling a calibration signal and transferring packets of charge corresponding to a fractional portion of the calibration signal to the integrating capacitor in each modulator cycle.

11. A delta sigma modulator, comprising:

a feedback signal sampling section for sampling a feedback signal and transferring charge packets corresponding to such sampled feedback signal to a summing node;

an input signal sampling section having a plurality of, N, capacitors for, during a normal mode, simultaneously sampling an input voltage with the plurality of, N, capacitors producing N charge packets and transferring the N charge packets to the summing node and, during a calibration mode, simultaneously sampling a calibration voltage with a subset, n, of the N plurality of capacitors, where n is less than N, producing n charge packets and transferring the n charge packets to the summing node.

12. The delta sigma modulator recited in claim 11 wherein n=1.

13. The delta sigma modulator recited in claim 11 wherein during each of the samplings of the calibration voltage, the subset of capacitors includes a different one, or ones, of the N capacitors, and wherein each of the N capacitors is included in at least one of the samplings of the calibration voltage.

\* \* \* \* \*